United States Patent
Han et al.

(10) Patent No.: US 11,404,530 B2
(45) Date of Patent: Aug. 2, 2022

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Linhong Han, Beijing (CN); Meng Zhang, Beijing (CN); Tingliang Liu, Beijing (CN); Yi Qu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/280,496

(22) PCT Filed: Jun. 30, 2020

(86) PCT No.: PCT/CN2020/099155
§ 371 (c)(1),
(2) Date: Mar. 26, 2021

(87) PCT Pub. No.: WO2022/000240
PCT Pub. Date: Jan. 6, 2022

(65) Prior Publication Data
US 2022/0199738 A1 Jun. 23, 2022

(51) Int. Cl.
*H01L 27/32* (2006.01)
*G09G 3/32* (2016.01)

(52) U.S. Cl.
CPC .......... *H01L 27/3276* (2013.01); *G09G 3/32* (2013.01); *G09G 2310/06* (2013.01);
(Continued)

(58) Field of Classification Search
CPC .. H01L 27/3276; G09G 3/32; G09G 2310/06; G09G 2310/08; G09G 2330/06; G09G 2330/12
See application file for complete search history.

(56) References Cited

U.S. PATENT DOCUMENTS

| | | |
|---|---|---|
| 10,718,964 B2 | 7/2020 | Park |
| 2014/0184989 A1 | 7/2014 | Park |
| | (Continued) | |

FOREIGN PATENT DOCUMENTS

| | | |
|---|---|---|
| CN | 103901641 A | 7/2014 |
| CN | 106652870 A | 5/2017 |
| | (Continued) | |

OTHER PUBLICATIONS

International Search report dated Mar. 18, 2021, issued in counterpart Application No. PCT/CN2020/099155. (4 pages).

*Primary Examiner* — Andrew Sasinowski
(74) *Attorney, Agent, or Firm* — WHDA, LLP

(57) ABSTRACT

A display substrate and a display device are provided. The display substrate includes: a base substrate; a plurality of first data line leads; a plurality of multiplex switches and at least two control lines electrically coupled to the plurality of multiplex switches; a plurality of second data line leads; a plurality of first pads and a plurality of second pads; and at least two connecting lines coupled to the at least two control lines and at least two of the plurality of second pads; wherein a length of any of the at least two connecting lines is longer than a vertical distance from any of the at least two second pads to a control line coupled to any of the at least two connecting lines.

20 Claims, 12 Drawing Sheets

(52) U.S. Cl.
CPC ..... *G09G 2310/08* (2013.01); *G09G 2330/06* (2013.01); *G09G 2330/12* (2013.01)

(56) References Cited

U.S. PATENT DOCUMENTS

| | | | |
|---|---|---|---|
| 2017/0104010 A1 | 4/2017 | Hekstra | |
| 2019/0121476 A1* | 4/2019 | Jang | G06F 3/0412 |
| 2019/0156768 A1* | 5/2019 | Xing | G09G 3/3648 |
| 2019/0311676 A1* | 10/2019 | Chaji | G09G 3/3233 |
| 2019/0362666 A1* | 11/2019 | Chen | H03K 17/693 |
| 2020/0193914 A1* | 6/2020 | Shin | G09G 3/3688 |
| 2020/0381458 A1* | 12/2020 | Yang | H01L 27/3218 |

FOREIGN PATENT DOCUMENTS

| | | |
|---|---|---|
| CN | 109143645 A | 1/2019 |
| CN | 109637352 A | 4/2019 |
| CN | 111323949 A | 6/2020 |

\* cited by examiner

DISPLAY SUBSTRATE AND DISPLAY DEVICE

CROSS REFERENCE TO RELATED APPLICATIONS

This application is a Section 371 National Stage Application of International Application No. PCT/CN2020/099155, filed on Jun. 30, 2020, entitled "DISPLAY SUBSTRATE AND DISPLAY DEVICE", which is incorporated herein by reference in their entirety.

TECHNICAL FIELD

The present disclosure relates to the field of display technology, and more particularly, to a display substrate and a display device.

BACKGROUND

With development of display technology, requirements for display devices are also moving towards to be thinner and lighter. In a display device, various circuits and wirings are usually arranged in a limited space. In this case, electromagnetic interference is usually generated in the space, thereby affecting display effect.

SUMMARY

Embodiments of the present disclosure provide a display substrate and a display device.

According to an aspect of the embodiments of the present disclosure, there is proposed a display substrate, including: a base substrate including an active area and a peripheral area surrounding the active area; a plurality of sub-pixels located in the active area; a plurality of data lines located in the active area and electrically coupled to the plurality of sub-pixels; a plurality of first data line leads located in the peripheral area and electrically coupled to the plurality of data lines; a plurality of multiplex switches located in the peripheral area and on a side of the plurality of first data line leads away from the active area; at least two control lines located in the peripheral area and electrically coupled to the plurality of multiplex switches; a plurality of second data line leads located in the peripheral area and on a side of the plurality of multiplex switches away from the active area; a plurality of pads located in the peripheral area and on a side of the plurality of second data line leads away from the active area, wherein the plurality of pads include a plurality of first pads and a plurality of second pads, the plurality of second pads are located on at least one side of the plurality of first pads in an extension direction along a boundary of the active area, and the plurality of first pads are electrically coupled to the plurality of second data line leads; and at least two connecting lines coupled to the at least two control lines and at least two of the plurality of second pads; wherein at least one of the plurality of multiplex switches is electrically coupled to at least two of the plurality of first data line leads and one of the plurality of second data line leads, and a length of any of the at least two connecting lines is longer than a vertical distance from any of the at least two second pads to any of the at least two control lines coupled to any of the at least two connecting lines.

In some embodiments, the at least two control lines include a first control line and a second control line; and at least one of the plurality of multiplex switches includes a first transistor and a second transistor, a gate of the first transistor is electrically coupled to the first control line, and a gate of the second transistor is electrically coupled to the second control line.

In some embodiments, the display substrate further includes a plurality of first power lines located in the active area and a first power bus located in the peripheral area, wherein the plurality of first power lines are electrically coupled to the first power bus, and the plurality of first power lines are electrically coupled to the plurality of sub-pixels; and wherein, orthographic projections of the at least two connecting lines on the base substrate at least partially overlap with an orthographic projection of the first power bus on the base substrate.

In some embodiments, the display substrate further includes a second power line located in the peripheral area and surrounding the active area; wherein the orthographic projections of the at least two connecting lines on the base substrate at least partially overlap with an orthographic projection of the second power line on the base substrate.

In some embodiments, the at least two connecting lines include a first wiring segment and a second wiring segment extending in a first direction and a third wiring segment extending in a second direction, and the third wiring segment is coupled to the first wiring segment and the second wiring segment; and wherein orthographic projections of the first wiring segment and the second wiring segment on the base substrate at least partially overlap with the orthographic projections of the first power bus and the second power line on the base substrate respectively.

In some embodiments, the display substrate further includes: a first switch signal line, a second switch signal line, a third switch signal line and a fourth switch signal line, located between the plurality of multiplex switches and the active area; a first unit testing circuit located between the plurality of multiplex switches and the active area, wherein the first unit testing circuit includes a plurality of first testing sub-circuits, at least one of the plurality of first testing sub-circuits includes a third transistor, a fourth transistor and a fifth transistor, a gate of the third transistor is electrically coupled to the first switch signal line, a gate of the fourth transistor is electrically coupled to the second switch signal line, and a gate of the fifth transistor is electrically coupled to the third switch signal line; and a second unit testing circuit located between the first unit testing circuit and the plurality of multiplex switches, wherein the second unit testing circuit includes a plurality of second testing sub-circuits, at least one of the plurality of second testing sub-circuits includes a sixth transistor, and a gate of the sixth transistor is electrically coupled to the fourth switch signal line; wherein orthographic projections of the at least two connecting lines on the base substrate at least partially overlap with an orthographic projection of at least one of the first switch signal line, the second switch signal line, the third switch signal line and the fourth switch signal line on the base substrate.

In some embodiments, the at least two connecting lines include a first wiring segment and a second wiring segment extending in a first direction and a third wiring segment extending in a second direction, and the third wiring segment is coupled to the first wiring segment and the second wiring segment; and wherein orthographic projections of the first wiring segment and the second wiring segment on the base substrate at least partially overlap with orthographic projections of the first switch signal line, the second switch signal line, the third switch signal line and the fourth switch signal line on the base substrate respectively.

In some embodiments, the at least two connecting lines include a first connecting line and a second connecting line, the first connecting line includes a first sub-line of first connecting line and a second sub-line of first connecting line, and the second connecting line includes a first sub-line of second connecting line and a second sub-line of second connecting line; the at least two control lines include a first control line and a second control line, and the second control line is located on a side of the first control line away from the active area; and the first sub-line of first connecting line and the second sub-line of first connecting line are respectively coupled to two end points of the first control line, and the first sub-line of second connecting line and the second sub-line of second connecting line are respectively coupled to two end points of the second control line.

In some embodiments, the display substrate further includes a plurality of first power lines located in the active area and a first power bus located in the peripheral area, wherein the plurality of first power lines are electrically coupled to the first power bus, and the plurality of first power lines are electrically coupled to the plurality of sub-pixels; the first power bus includes a first sub-line of first power bus and a second sub-line of first power bus, wherein the first sub-line of first power bus and the second sub-line of first power bus are respectively located on two sides of the plurality of multiplex switches; and wherein orthographic projections of the first sub-line of first connecting line and the first sub-line of second connecting line on the base substrate at least partially overlap with an orthographic projection of the first sub-line of first power bus on the base substrate, and orthographic projections of the second sub-line of first connecting line and the second sub-line of second connecting line on the base substrate at least partially overlap with an orthographic projection of the second sub-line of first power bus on the base substrate.

In some embodiments, the display substrate further includes a second power line located in the peripheral area and surrounding the active area; wherein the second power line includes a first sub-line of second power line and a second sub-line of second power line, and the first sub-line of second power line and the second sub-line of second power line are respectively located on two sides of the plurality of multiplex switches; and wherein the orthographic projections of the first sub-line of first connecting line and the first sub-line of second connecting line on the base substrate at least partially overlap with an orthographic projection of the first sub-line of second power line on the base substrate, and the orthographic projections of the second sub-line of first connecting line and the second sub-line of second connecting line on the base substrate at least partially overlap with an orthographic projections of the second sub-line of second power line on the base substrate.

In some embodiments, the display substrate further includes between the plurality of multiplex switches and the active area: a first switch signal line including a first sub-line of first switch signal line and a second sub-line of first switch signal line, a second switch signal line including a first sub-line of second switch signal line and a second sub-line of second switch signal line, a third switch signal line including a first sub-line of third switch signal line and a second sub-line of third switch signal line, and a fourth switch signal line including a first sub-line of fourth switch signal line and a second sub-line of fourth switch signal line; wherein the at least two connecting lines include a first connecting line and a second connecting line, the first connecting line includes a first sub-line of first connecting line and a second sub-line of first connecting line, and the second connecting line includes a first sub-line of second connecting line and a second sub-line of second connecting line; the first sub-line of first connecting line, the first sub-line of second connecting line, the second sub-line of first connecting line, and the second sub-line of second connecting line are respectively located on two sides of the plurality of multiplex switches; orthographic projections of the first sub-line of first connecting line and the first sub-line of second connecting line on the base substrate at least partially overlap with an orthographic projection of at least one of the first sub-line of first switch signal line, the first sub-line of second switch signal line, the first sub-line of third switch signal line and the first sub-line of fourth switch signal line on the base substrate; orthographic projections of the second sub-line of first connecting line and the second sub-line of second connecting line on the base substrate at least partially overlap with an orthographic projection of at least one of the second sub-line of first switch signal line, the second sub-line of second switch signal line, the second sub-line of third switch signal line and the second sub-line of fourth switch signal line on the base substrate.

In some embodiments, the plurality of second pads include a plurality of first sub-pads of second pads and a plurality of second sub-pads of second pads, wherein the plurality of first sub-pads of second pads and the plurality of second sub-pads of second pads are respectively located on two sides of the plurality of first pads in the extension direction along the boundary of the active area.

In some embodiments, the first sub-line of first connecting line and the first sub-line of second connecting line are electrically coupled to the plurality of first sub-pads of second pads, and the second sub-line of first connecting line and the second sub-line of second connecting line are electrically coupled to the plurality of second sub-pads of second pads.

In some embodiments, the plurality of pads further include a plurality of third pads arranged along the extension direction of the boundary of the active area, and located on a side of the plurality of first pads and the plurality of second pads away from the active area, wherein the plurality of first pads, the plurality of second pads and the plurality of third pads are configured to be bound to an integrated circuit.

In some embodiments, the display substrate further includes a plurality of fourth pads arranged along the extension direction of the boundary of the active area, and located on a side of the plurality of third pads away from the active area, wherein the first switch signal line, the second switch signal line, the third switch signal line, and the fourth switch signal line are electrically coupled to the plurality of fourth pads.

In some embodiments, the plurality of fourth pads include a plurality of first sub-pads of fourth pads and a plurality of second sub-pads of fourth pads, and the plurality of first sub-pads of fourth pads and the plurality of second sub-pads of fourth pads are respectively located on two sides of the plurality of third pads in the extension direction along the boundary of the active area; the first sub-line of first switch signal line, the first sub-line of second switch signal line, the first sub-line of third switch signal line, and the first sub-line of fourth switch signal line are electrically coupled to the plurality of first sub-pads of fourth pads; and the second sub-line of first switch signal line, the second sub-line of second switch signal line, the second sub-line of third switch signal line, and the second sub-line of fourth switch signal line are electrically coupled to the plurality of second sub-pads of fourth pads.

In some embodiments, the first sub-line of first power bus and the first sub-line of second power line are electrically coupled to the plurality of first sub-pads of fourth pads, and the second sub-line of first power bus and the second sub-line of second power line are electrically coupled to the plurality of second sub-pads of fourth pads.

In some embodiments, resistance of the at least two connecting lines is in a range of 400Ω to 600Ω.

According to another aspect of the embodiments of the present disclosure, there is proposed a display panel including the display substrate of various embodiments.

According to another aspect of the embodiments of the present disclosure, there is proposed a display device including the display substrate of various embodiments.

BRIEF DESCRIPTION OF THE ACCOMPANYING DRAWINGS

In order to explain technical solutions of the embodiments of the present disclosure more clearly, drawings which are needed to be used in the description of the embodiments of the present disclosure will be briefly introduced in the following. Obviously, the drawings in the following description are only some embodiments of the present disclosure. For those of ordinary skill in the art, other drawings can be obtained without creative work based on these drawings, in which.

DETAILED DESCRIPTION

Figure 1:
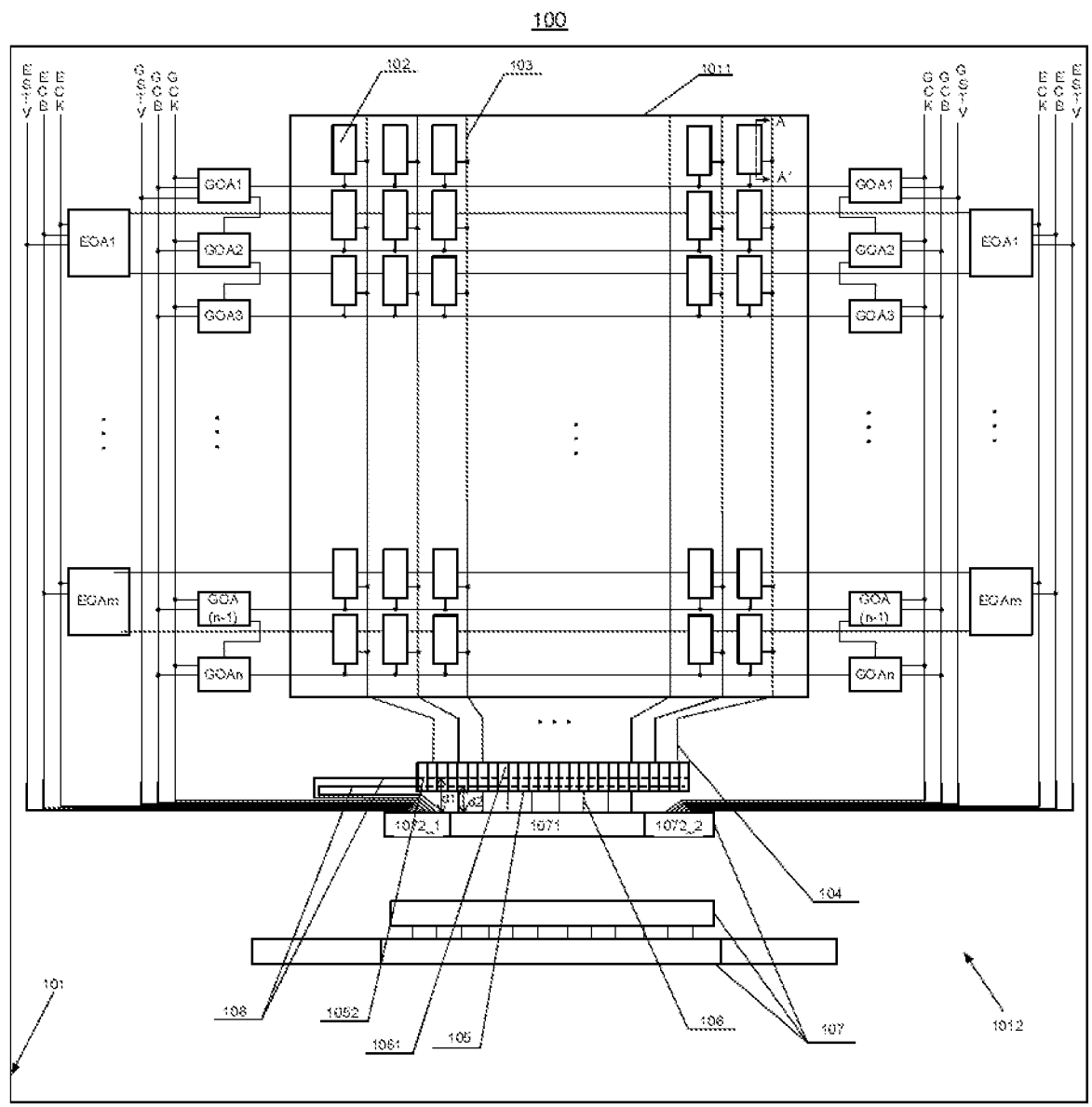
FIG. 1 shows a schematic structural diagram of a display substrate according to embodiments of the present disclosure.

In order to make objectives, technical solutions, and advantages of the embodiments of the present disclosure clearer, the technical solutions in the embodiments of the present disclosure may be described clearly and completely in conjunction with the accompanying drawings in the embodiments of the present disclosure. Obviously, the embodiments described are part of the embodiments of the present disclosure, but not all of them. Based on the described embodiments of the present disclosure, all other embodiments obtained by those of ordinary skill in the art without creative work are within the protection scope of the present disclosure. It should be noted that throughout the drawings, the same elements are represented by the same or similar reference signs. In the following description, some specific embodiments are only used for descriptive purposes, and should not be construed as limiting the present disclosure, but are merely examples of the embodiments of the present disclosure. When a confusion in the understanding of the present disclosure may be caused, conventional structures or configurations may be omitted. It should be noted that the shape and size of each component in the drawings do not reflect an actual size and ratio, but merely illustrate the content of the embodiments of the present disclosure.

Unless otherwise defined, technical terms or scientific terms used in the embodiments of the present disclosure should have usual meanings understood by those skilled in the art. The "first", "second" and similar words used in the embodiments of the present disclosure do not denote any order, quantity or importance, but are only used to distinguish different components.

In addition, in the description of the embodiments of the present disclosure, the term "electrically coupled" may mean that two components are directly electrically coupled, or may mean that two components are electrically coupled via one or more other components. In addition, these two components may be electrically coupled or coupled in a wired or wireless manner.

The embodiments of the present disclosure may be described in details below with reference to the drawings.

FIG. 1 shows a schematic structural diagram of a display substrate 100 according to embodiments of the present disclosure.

As shown in FIG. 1, a display substrate 100 includes a base substrate 101, a plurality of sub-pixels 102, a plurality of data lines 103, a plurality of first data line leads 104, a MUX unit 105, a plurality of second data line leads 106, a plurality of pads 107 and at least two connecting lines 108.

As shown in FIG. 1, the base substrate 101 includes an active area 1011 and a peripheral area 1012 surrounding the active area 1011. The plurality of sub-pixels 102 are located in the active area 1011. The plurality of data lines 103 are located in the active area 1011 and are electrically coupled to the plurality of sub-pixels 102. The plurality of first data line leads 104 are located in the peripheral area 1012 and are electrically coupled to the plurality of data lines 103.

The multiplex circuit (MUX) unit 105 is located in the peripheral area 1012 and on a side of the plurality of first data line leads 104 away from the active area 1011. The MUX unit 105 includes a plurality of multiplex switches 1051 and at least two control lines 1052. In FIG. 1, structures of the plurality of multiplex switches 1051 are shown as a rectangular frame, and the at least two control lines 1052 are shown as dotted lines. Specific structures of the plurality of multiplex switches 1051 and at least two control lines 1052 may be referred to FIG. 2A. The at least two control lines 1052 are located in the peripheral area 1012 and are electrically coupled to the plurality of multiplex switches 1051.

The plurality of second data line leads 106 are located in the peripheral area 1012 and on a side of the plurality of multiplex switches 1051 away from the active area 1011. The plurality of pads 107 are located in the peripheral area 1012 and on a side of the plurality of second data line leads 106 away from the active area 1011. The plurality of pads 107 include a plurality of first pads 1071 and a plurality of second pads 1072. The plurality of second pads 1072 are located on at least one side of the plurality of first pads 1071 in an extension direction along a boundary of the active area 1011. The plurality of first pads 1071 are electrically coupled to the plurality of second data line leads 106.

The at least two connecting lines 108 are coupled to the at least two control lines 1052 and at least two of the plurality of second pads 1072. Herein, at least one of the plurality of multiplex switches 1051 is electrically coupled to at least two of the plurality of first data line leads 104 and one of the plurality of second data line leads 106. A length of any of the at least two connecting lines 108 is longer than a vertical distance from any of the at least two second pads 1072 to a control line coupled to any of the at least two connecting lines 108. As shown in FIG. 1, the at least two control lines 1052 of the MUX unit 105 are shown as two control lines, but the embodiment of the present disclosure is not limited thereto. Herein, one connecting line of the at least two connecting lines 108 is coupled to one of the two control lines 1052 close to the active area 1011, and a length of this connecting line is longer than a vertical distance from one second pad of the second pads 1072 coupled to the connecting line to one control line of the control lines 1052 close to the active area 1011, and the vertical distance is shown by d1 in FIG. 1. One connecting line of the at least two connecting lines 108 is coupled to one of the two control lines 1052 away from the active area 1011, and a length of this connecting line is longer than a vertical distance from one second pad of the second pads 1072 coupled to the connecting line to one control line of the control lines 1052 away from the active area 1011, and the vertical distance is shown by d2 in FIG. 1.

Figure 2A:
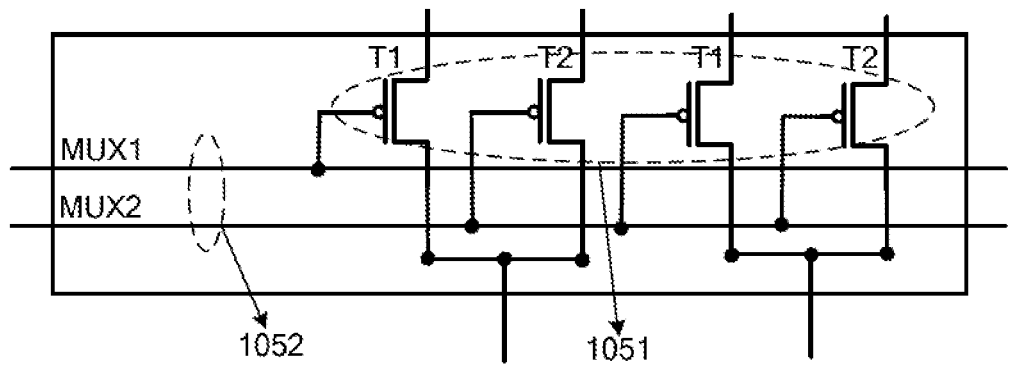
FIGS. 2A to 2C show schematic diagrams of a multiplex circuit unit.

A schematic enlarged structural diagram of a part of the MUX unit 105 is shown in FIG. 2A. The MUX unit 105 includes the plurality of multiplex switches 1051 and the at least two control lines 1052. In FIG. 2A, at least one of the plurality of multiplex switches 1051 is illustrated as a first transistor T1 and a second transistor T2, and the at least two control lines 1052 include a first control line MUX1 and a second control line MUX2. As shown in FIG. 2A, at least one of the plurality of multiplex switches 1051 includes a first transistor T1 and a second transistor T2. A gate of the first transistor T1 is electrically coupled to the first control line MUX1, and a gate of the second transistor T2 is electrically coupled to the second control line MUX2. A first electrode of the first transistor T1 is electrically coupled to a first electrode of the second transistor T2, the first transistor T1 being adjacent to the second transistor T2 herein, for receiving an input signal. A second electrode of the first transistor T1 and a second electrode of the second transistor T2 are respectively used as output terminals to transmit output signals.

Figure 2B:
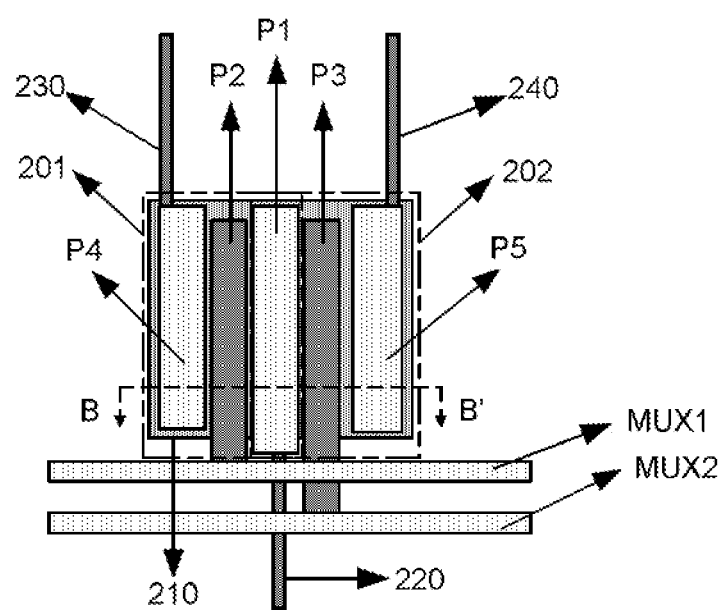

FIG. 2B shows a layout diagram of one of the MUX units shown in FIG. 2A. As shown in FIG. 2B, a MUX unit includes a pair of transistors T1 and T2. Herein, a part in a dotted frame 201 is T1, a part in a dotted frame 202 is T2, and T1 and T2 share a first electrode of a transistor. As shown in FIG. 2B, 210 represents an active layer used to form an active region of the first transistor T1 and the second transistor T2, P1 represents the first electrode of the first transistor T1 and the second transistor T2 electrically coupled together, P2 represents the gate of the first transistor T1, P3 represents the gate of the second transistor T2, P4 represents the second electrode of the first transistor T1, and P5 represents the second electrode of the second transistor T2. In FIG. 2B, the first control line MUX1 is arranged in a horizontal direction to be electrically coupled to P2, and the second control line MUX2 is arranged in the horizontal direction to be electrically coupled to P3. A lead 220 is electrically coupled to P1, and is used to electrically couple the first electrode of the first transistor T1 and the first electrode of the second transistor T2 to a pin (for example, a second pin) of a chip outputting a data signal. A lead 230 is electrically coupled to P4, and is used to transmit a data signal received by the first transistor T1 to a data line in the active area. A lead 240 is electrically coupled to P5, and is used to transmit a data signal received by the second transistor T2 to a data line in the active area.

Figure 2C:
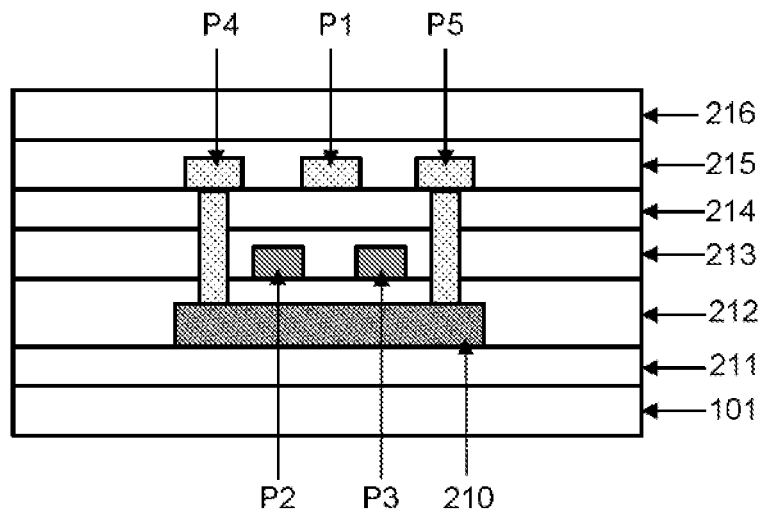

FIG. 2C shows a sectional diagram taken along a line BB' in FIG. 2B. As shown in FIG. 2C, 101 represents the base substrate, and a buffer layer 211, a first gate insulating layer 212, a second gate insulating layer 213, an interlayer insulating layer 214, a passivation layer 215 and a first planarization layer 216 are sequentially stacked on the base substrate 101. The active layer 210 is located between the buffer layer 211 and the first gate insulating layer 212. The gate P2 of the first transistor T1 and the gate P3 of the second transistor T2 are located between the first gate insulating layer 212 and the second gate insulating layer 213. The first electrode P1 shared by the first transistor T1 and the second transistor T1, the second electrode P4 of the first transistor T1 and the second electrode P5 of the second transistor T2 are located between the interlayer insulating layer 214 and the passivation layer 215. The second electrode P4 of the first transistor T1 and the second electrode P5 of the second transistor T2 are respectively coupled to the active layer 210 through via holes, and the via holes pass through the first gate insulating layer 212, the second gate insulating layer 213 and the interlayer insulating layer 214 sequentially.

Further, the active layer 210 used to form the active region of the first transistor T1 and the second transistor T2 is located in the same layer as a driving active layer of a driving thin film transistor included in at least one of the plurality of sub-pixels 102 in the active area 1011. The gate P2 of the first transistor T1 and the gate P3 of the second transistor T2 are located in the same layer as a driving gate of the driving thin film transistor included in at least one of the plurality of sub-pixels 102 in the active area 1011. The first electrode P1 shared by the first transistor T1 and the second transistor T2, the second electrode P4 of the first transistor T1, and the second electrode P5 of the second transistor T2 are located in the same layer as a driving source and a driving drain of the driving thin film transistor included in at least one of the plurality of sub-pixels 102 in the active area 1011. This will be described below in conjunction with FIG. 2D.

Figure 2D:
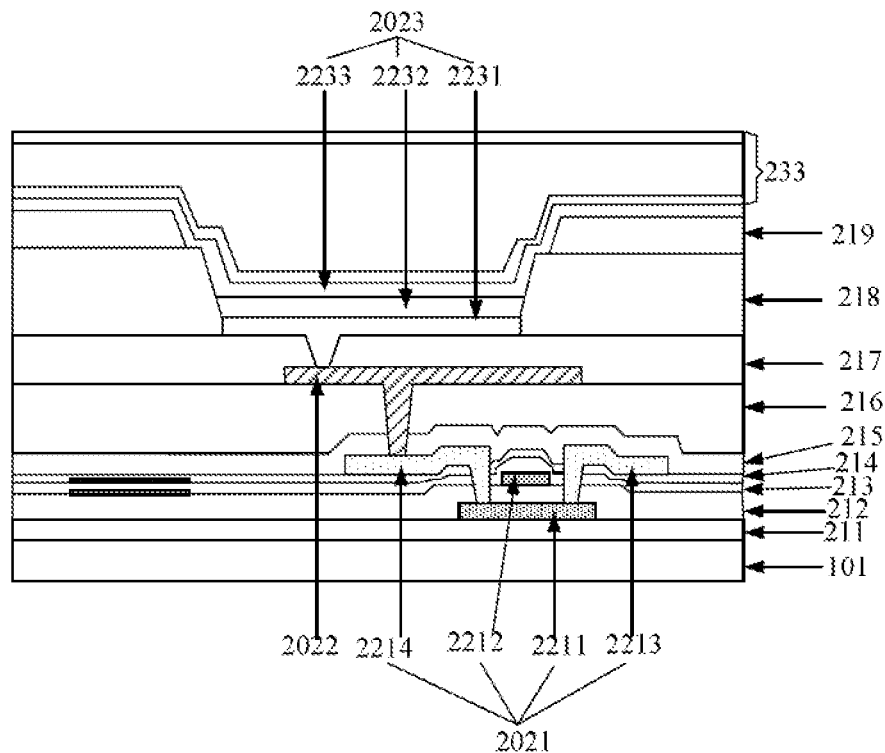
FIG. 2D shows a sectional diagram taken along AA' in FIG. 1.

FIG. 2D shows a sectional diagram taken along AA in FIG. 1. As shown in FIG. 2D, at least one of the plurality of sub-pixels 102 in the active area 1011 includes a driving thin film transistor 2021 and a connecting electrode 2022. Herein, the driving thin film transistor 2021 includes a driving active layer 2211 located on the base substrate 101, a driving gate 2212 located on a side of the driving active layer 2211 away from the base substrate 101, and a driving source 2213 and a driving drain 2214 located on a side of the driving gate 2212 away from the base substrate 101. The connecting electrode 2022 is located on a side of the driving source 2213 and the driving drain 2214 away from the base substrate 101. The sub-pixel in FIG. 2D may further include a light emitting diode 2023 (including a first light emitting electrode 2231, a light emitting layer 2232, and a second light emitting electrode 2233 sequentially arranged in a direction away from the base substrate 101), the light emitting diode 2023 is located at a side of the connecting electrode 2022 away from the base substrate 101, and the driving drain 2214, the connecting electrode 2022, and the light emitting diode 2023 are coupled sequentially.

As shown in FIG. 2D, the sub-pixel 102 may further include: a buffer layer 211, a first gate insulating layer 212, a second gate insulating layer 213, an interlayer insulating layer 214, a passivation layer 215, a first planarization layer 216, a second planarization layer 217, a pixel defining layer 218, a support layer 219, and an encapsulation layer 233 arranged in a direction away from the base substrate 101 sequentially. The driving active layer 2211 is located between the buffer layer 211 and the first gate insulating layer 212; the driving gate 2212 is located between the first gate insulating layer 212 and the second gate insulating layer 213; the driving source 2213 and the driving drain 2214 are located between the interlayer insulating layer 214 and the passivation layer 215; the connecting electrode 2022 is located between the first planarization layer 216 and the second planarization layer 217. The pixel defining layer 218 is configured to define a pixel area on the base substrate 101, and the light emitting diode 2023 is located in the pixel area.

Further, the buffer layer 211, the first gate insulating layer 212, the second gate insulating layer 213, the interlayer insulating layer 214, the passivation layer 215, the first planarization layer 216, and the second planarization layer 217 in the active area 1011 may all be extended to the peripheral area 1012, and a relative positional relationship of these film layers in the peripheral area 1012 is the same as that in the active area 1011.

Figure 3:
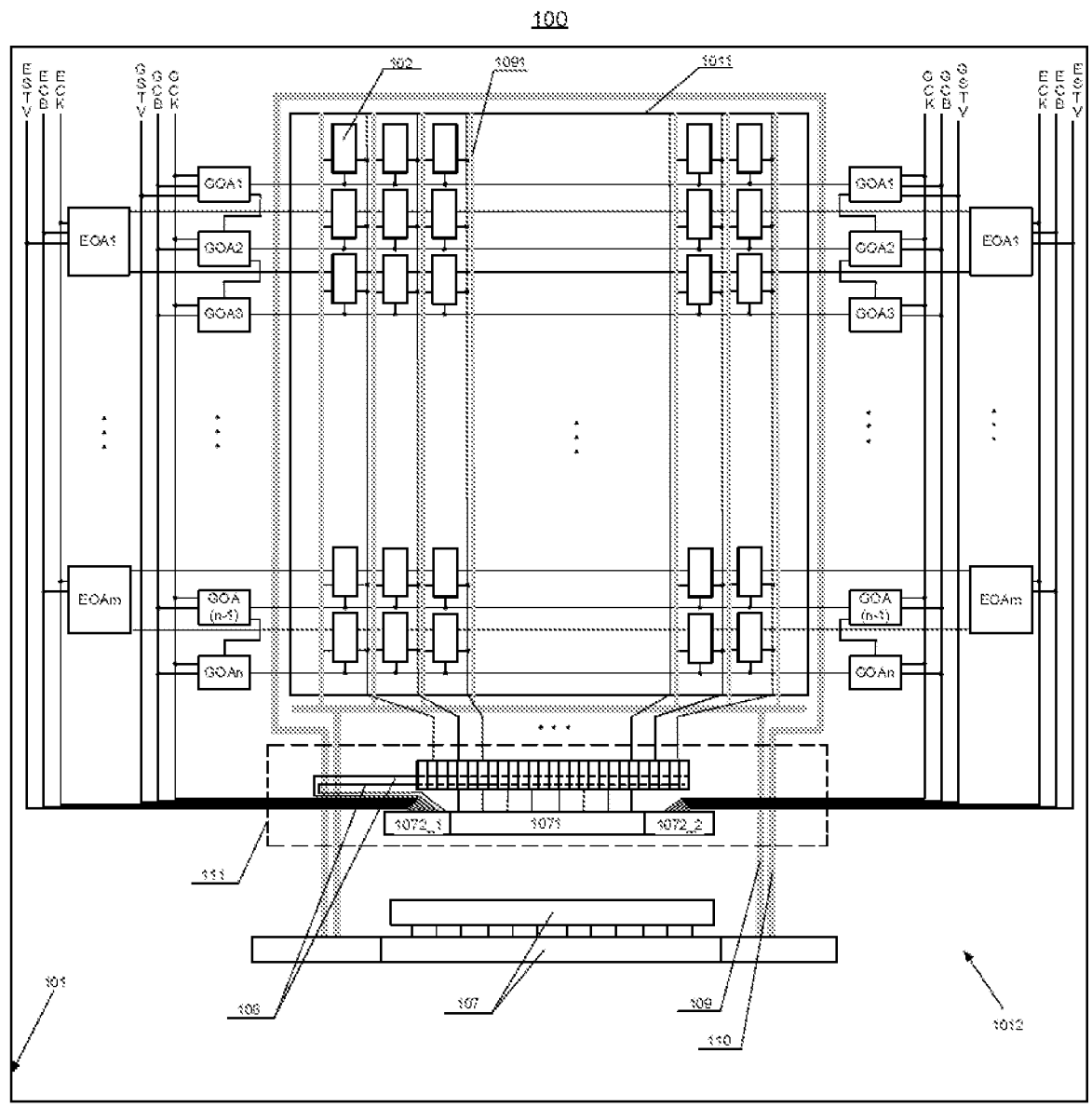
FIG. 3 shows a schematic structural diagram of a display substrate according to other embodiments of the present disclosure.

FIG. 3 shows a schematic structural diagram of a display substrate 100 according to other embodiments of the present disclosure. As shown in FIG. 3, the display substrate 100 further includes a plurality of first power lines 1091 located in the active area 1011 and a first power bus 109 located in the peripheral area 1012. The plurality of first power lines 1091 are electrically coupled to the first power bus 109, and the plurality of first power lines 1091 are electrically coupled to the plurality of sub-pixels 102. As shown in FIG. 3, orthographic projections of the at least two connecting lines 108 on the base substrate 101 at least partially overlap with an orthographic projection of the first power bus 109 on the base substrate 101.

As shown in FIG. 3, the display substrate 100 further includes a second power line 110 located in the peripheral area 1012 and surrounding the active area 1011. As shown in FIG. 3, the orthographic projections of the at least two connecting lines 108 on the base substrate 101 at least partially overlap with an orthographic projection of the second power line 110 on the base substrate 101.

According to the embodiments, the at least two connecting lines 108 may include a first wiring segment and a second wiring segment extending in a first direction and a third wiring segment extending in a second direction, and the third wiring segment is coupled to the first wiring segment and the second wiring segment.

Figure 4:
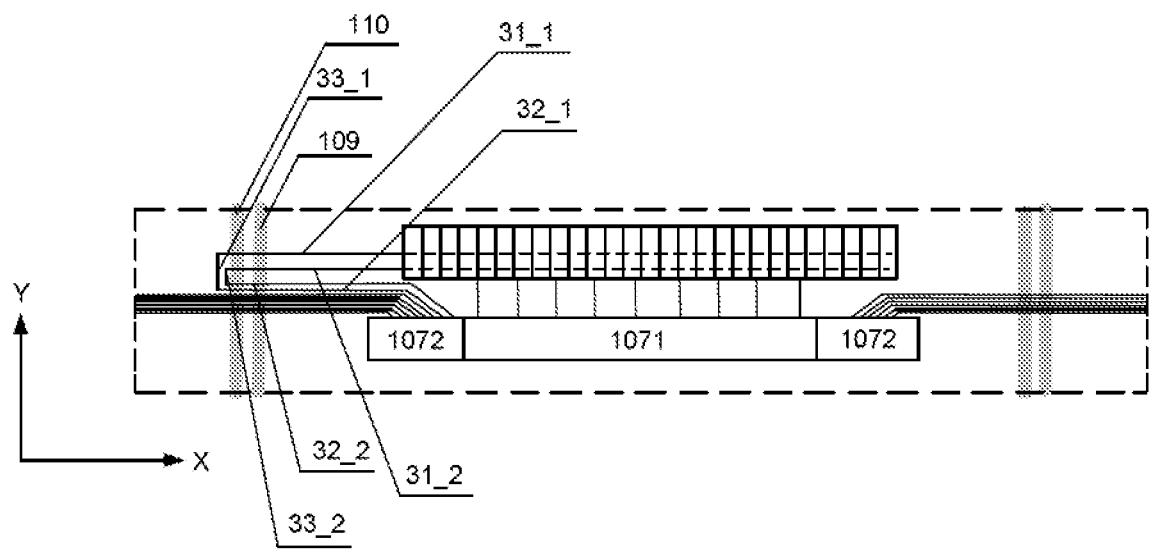
FIG. 4 shows an enlarged diagram of a part illustrated by a dotted frame 111 in FIG. 3.

FIG. 4 shows an enlarged diagram of a part illustrated by a dotted frame 111 in FIG. 3. As shown in FIG. 4, the at least two connecting lines 108 may include horizontal wiring segments 31_1, 31_2 and 32_1, 32_2 extending in an X direction, and may also include vertical wiring segments 33_1 and 33_2 extending in a Y direction. The vertical wiring segment 33_1 is coupled to the horizontal wiring segments 31_1 and 32_1, and the vertical wiring segment 33_2 is coupled to the horizontal wiring segments 31_2 and 32_2. As shown in FIG. 4, orthographic projections of the first wiring segment (horizontal wiring segments 31_1 and 31_2) and the second wiring segment (horizontal wiring segments 32_1 and 32_2) on the base substrate 101 at least partially overlap with the orthographic projections of the first power bus 109 and the second power line 110 on the base substrate 101.

Figure 5:
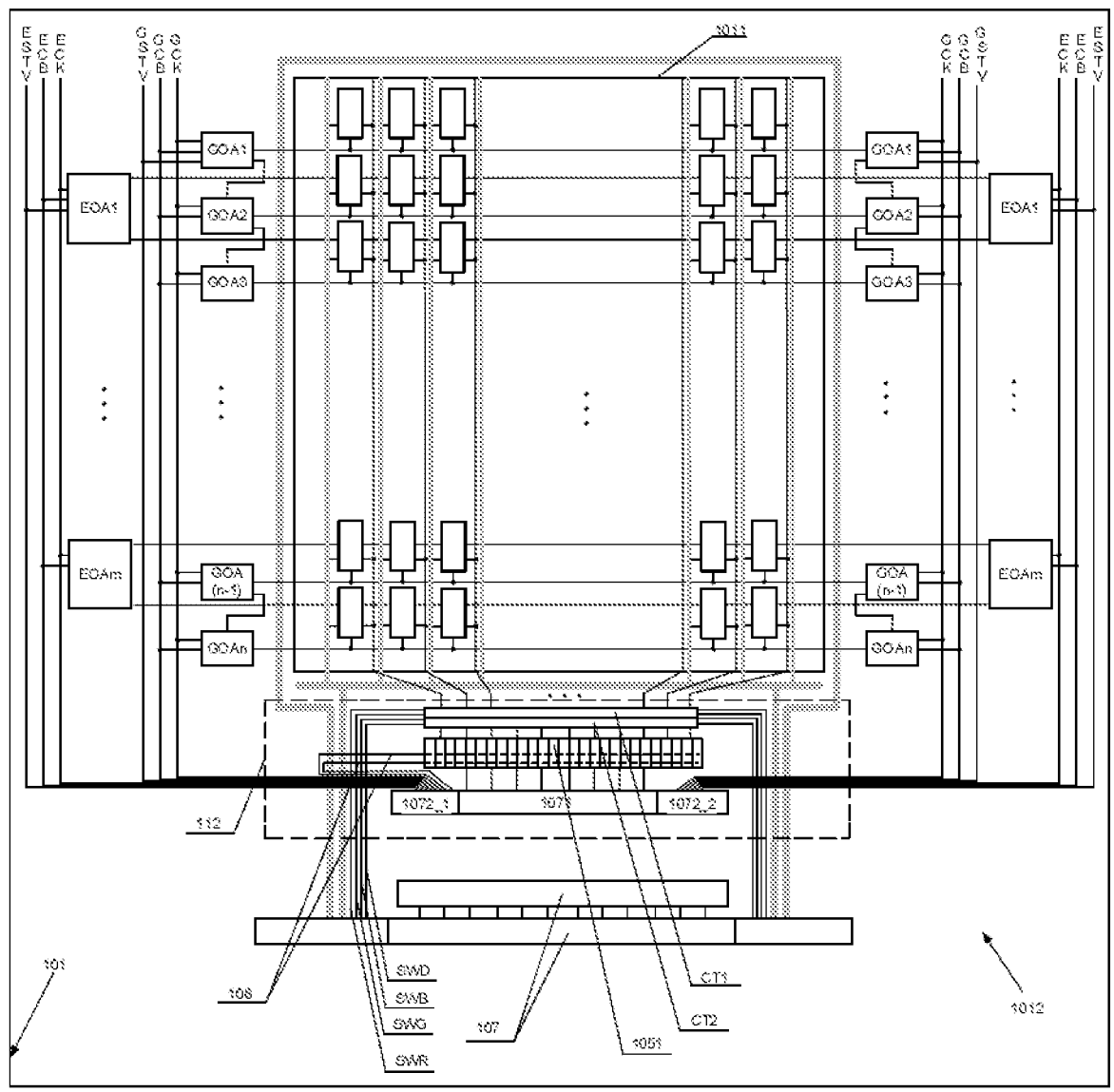
FIG. 5 shows a schematic structural diagram of a display substrate according to other embodiments of the present disclosure.

FIG. 5 shows a schematic structural diagram of a display substrate according to other embodiments of the present disclosure. As shown in FIG. 5, the display substrate 100 further includes a first switch signal line SWR, a second switch signal line SWG, a third switch signal line SWB, a fourth switch signal line SWD, a first unit testing circuit CT1, and a second unit testing circuit CT2.

As shown in FIG. 5, the first switch signal line SWR, the second switch signal line SWG, the third switch signal line SWB, and the fourth switch signal line SWD are located between the plurality of multiplex switches 1051 and the active area 1011.

Figure 6:
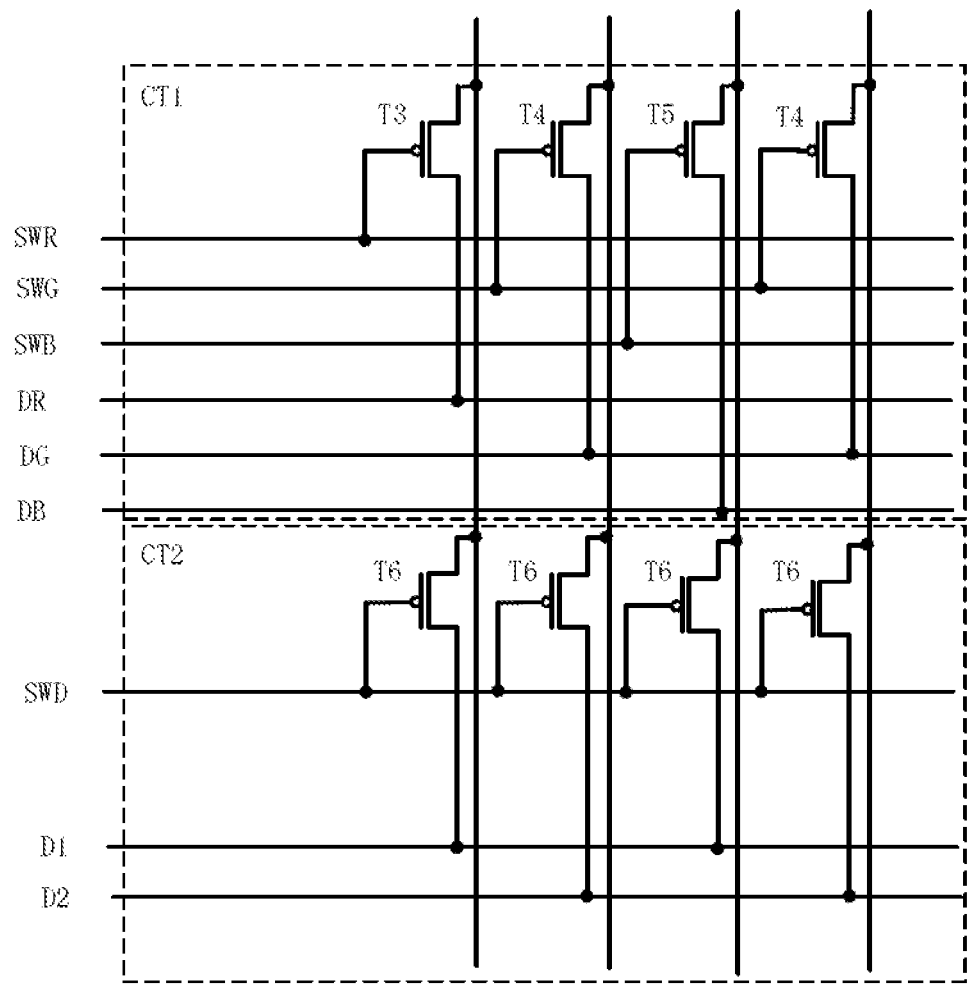
FIG. 6 shows an equivalent circuit diagram of a test circuit.

As shown in FIG. 5, the first unit testing circuit CT1 is located between the plurality of multiplex switches 1051 and the active area 1011. The first unit testing circuit CT1 includes a plurality of first testing sub-circuits. An equivalent circuit diagram of the plurality of first testing sub-circuits is shown in FIG. 6. At least one of the plurality of first testing sub-circuits includes a third transistor T3, a fourth transistor T4, and a fifth transistor T5. As shown in FIG. 6, a gate of the third transistor T3 is electrically coupled to the first switch signal line SWR, a gate of the fourth transistor T4 is electrically coupled to the second switch signal line SWG, and a gate of the fifth transistor T5 is electrically coupled to the third switch signal line SWB.

As shown in FIG. 5, the second unit testing circuit CT2 is located between the first unit testing circuit CT1 and the plurality of multiplex switches 1051. The second unit testing circuit CT2 includes a plurality of second testing sub-circuits. An equivalent circuit diagram of the plurality of second testing sub-circuits is shown in FIG. 6. At least one of the plurality of second testing sub-circuits includes a sixth transistor T6, and a gate of the sixth transistor T6 is electrically coupled to the fourth switch signal line SWD.

As shown in FIG. 5, orthographic projections of the at least two connecting lines 108 on the base substrate 101 at least partially overlap with an orthographic projection of at least one of the first switch signal line SWR, the second switch signal line SWG, the third switch signal line SWB, and the fourth switch signal line SWD on the base substrate 101.

According to the embodiments, the at least two connecting lines 108 may include a first wiring segment and a second wiring segment extending in a first direction, and a third wiring segment extending in a second direction. The third wiring segment is coupled to the first wiring segment and the second wiring segment.

Figure 7:
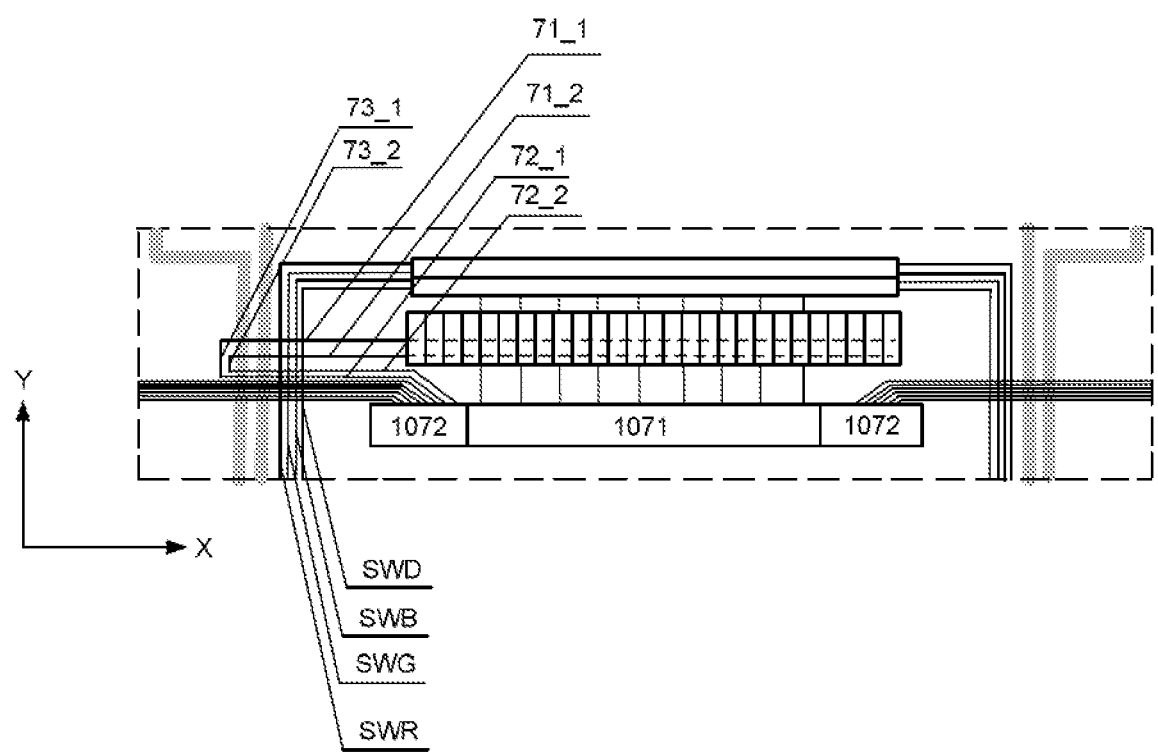
FIG. 7 shows an enlarged diagram of a part s illustrated by a dotted frame 112 in FIG. 5.

FIG. 7 shows an enlarged diagram of a part illustrated by a dotted frame 112 in FIG. 5. As shown in FIG. 7, the at least two connecting lines 108 may include horizontal wiring segments 71_1, 71_2 and 72_1, 72_2 extending in an X direction, and may also include vertical wiring segments 73_1 and 73_2 extending in a Y direction. The vertical wiring segment 73_1 is coupled to the horizontal wiring segments 71_1 and 72_1, and the vertical wiring segment 73_2 is coupled to the horizontal wiring segments 71_2 and 72_2. As shown in FIG. 7, orthographic projections of the first wiring segment (horizontal wiring segments 71_1 and 71_2) and the second wiring segment (horizontal wiring segments 72_1 and 72_2) on the base substrate 101 at least partially overlap with orthographic projections of the first switch signal line SWR, the second switch signal line SWG, the third switch signal line SWB and the fourth switch signal line SWD on the base substrate 101.

Figure 8A:
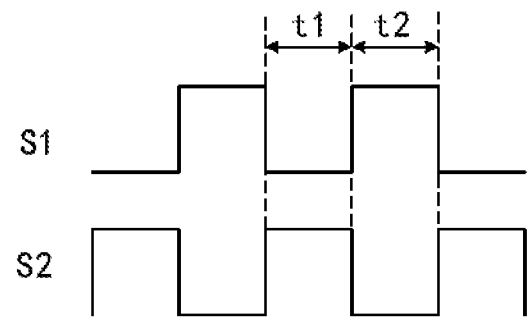
FIGS. 8A and 8B show waveform diagrams of selection signals in connecting lines.
Figure 8B:
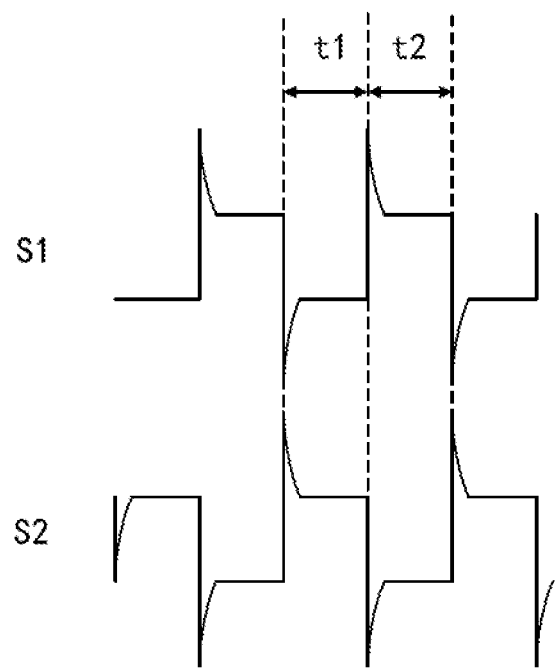

FIGS. 8A and 8B show waveform diagrams of selection signals in connecting lines, and two connecting lines are taken as an example for description. Selection signal S1 is transmitted in one connecting line, selection signal S2 is transmitted in another connecting line, and the selection signals S1 and S2 are both pulse signals. In a display of one frame, levels of the selection signals S1 and S2 are switched once, to respectively conduct transmission paths of two adjacent data signals. Referring to FIGS. 2A and 8A, a display period of one frame is divided into two periods t1 and t2. During a first period t1, the selection signal S1 is at a low level and the selection signal S2 is at a high level, the first transistor T1 is turned on and the second transistor T2 is turned off. During a second period t2, the selection signal S1 is at a high level and the selection signal S2 is at a low level, the second transistor T2 is turned on and the first transistor T1 is turned off.

If wirings of the at least two connecting lines is set according to a shorter path from a pin of an integrated circuit IC to the at least two control lines, for example, a vertical distance from any of the second pads to the at least two control lines, the selection signals S1 and S2 may cause electromagnetic interference in a space around. This is because waveforms of the selection signals S1 and S2 usually have spikes. As shown in FIG. 8B, there are spikes at rising and falling edges of the selection signals S1 and S2. When such a selection signal with a spike occurs at high frequencies, electromagnetic interference may be generated in the space around, thereby affecting the display of a picture. For example, for a display substrate with a refresh frequency of 60 Hz, a display period of one frame is ⅟60 s. If one frame scans 3120 rows of sub-pixels, a scanning time of one row of sub-pixels is 1/(60*3120) s. Therefore, in the display of one frame of a picture, the selection signals S1 and S2 are switched once in 1/(60*3120) s. That is, for a refresh frequency of 60 Hz, the frequency of the selection signals S1 and S2 is 60*3120*2 Hz. At a frequency of 60*3120*2 Hz, when the waveforms of the selection signals S1 and S2 have spikes, electromagnetic interference may be generated in the space around.

According to the embodiments, wiring paths of the at least two connecting lines 108 are arranged in a detour routing, to increase the length of the connecting lines, thereby suppressing the generation of electromagnetic interference and improving the quality of the selection signals. According to the embodiments, resistance of the at least two connecting lines 108 may be in a range of 400Ω to 600Ω, so that a time constant of the transmission rout formed by the at least two connecting lines 108 may be increased, to slow down the transformation of the selection signal from a high level to a low level and the transformation from a low level to a high level, i.e. a rising time and a failing time of the selection signal may be increased. According to the embodiments, when the orthographic projections of the at least two connecting lines 108 on the base substrate 101 at least partially overlap with the orthographic projection of the first power bus 109, the second power line 110 or the orthographic projections of the first switch signal line SWR, the second switch signal line SWG, the third switch signal line SWB and the fourth switch signal line SWD on the base substrate 101, capacitance may be formed between the at least two connecting lines 108 and the first power bus 109, the second power line 110 or the first switch signal line SWR, the second switch signal line SWG, the third switch signal line SWB, and the fourth switch signal line SWD, so that the time constant of the transmission rout formed by the at least two connecting lines 108 may be increased to slow down the transformation of the selection signal from a high level to a low level and the transformation from a low level to a high level, i.e. a rising time and a falling time of the selection signal may be increased. As a result, it is possible to suppress spikes in waveforms of the selection signals, thereby suppressing the generation of electromagnetic interference and improving the quality of the selection signal.

Figure 9A:
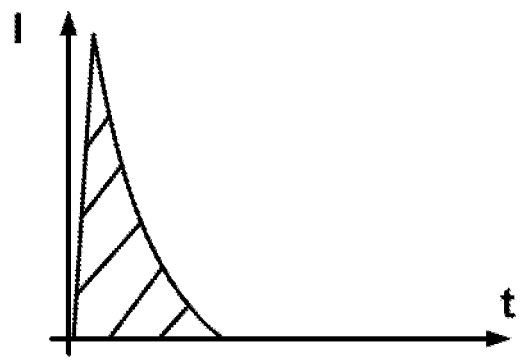
FIGS. 9A and 9B show discharge effect of a spike part in a selection signal.
Figure 9B:
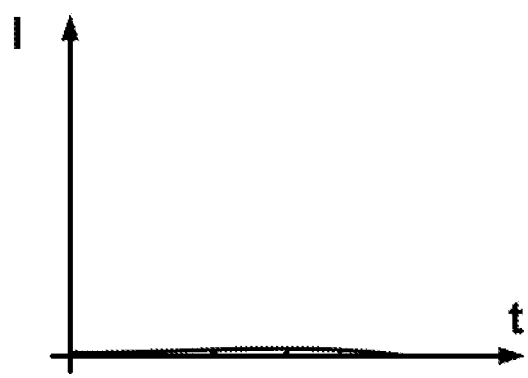

FIGS. 9A and 9B show discharge effect of a spike part in a selection signal, among which, FIG. 9A shows the discharge effect of charge carried by the spike part when the spike part in the selection signal is not suppressed, and FIG. 9B shows the discharge effect of the charge carried by the spike part when the spike part in the selection signal is suppressed according to the embodiments of the present disclosure. As shown in FIG. 9A, when the spike part in the selection signal is not suppressed, the charge carried by the selection signal may be released immediately, generating a relatively large current and electromagnetic interference. As shown in FIG. 9B, when the spike part in the selection signal is suppressed according to the embodiments of the present disclosure, the charge carried by the selection signal is released slowly and the current generated is small, effectively suppressing the electromagnetic interference.

In order to further suppress the electromagnetic interference generated by the spike part in the selection signal, at least two connecting lines may be symmetrically arranged with respect to the display substrate 100, which will be described below with reference to FIG. 10.

Figure 10:
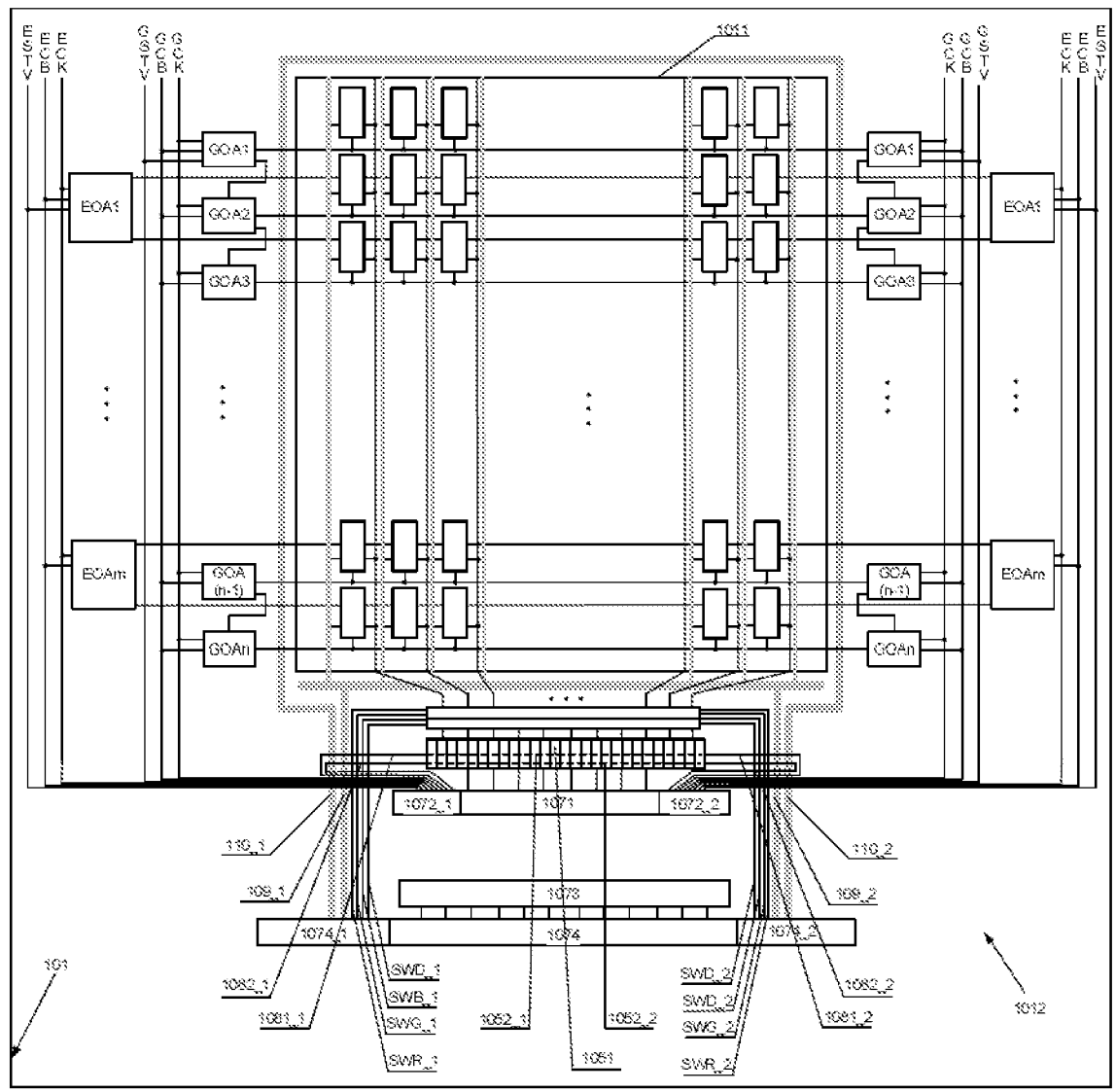
FIG. 10 shows a schematic structural diagram of a display substrate according to other embodiments of the present disclosure.

FIG. 10 shows a schematic structural diagram of a display substrate according to other embodiments of the present disclosure. As shown in FIG. 10, the at least two connecting lines include a first connecting line 1081 and a second connecting line 1082. The first connecting line 1081 includes a first sub-line of first connecting line 1081_1 and a second sub-line of first connecting line 1081_2, and the first sub-line of first connecting line 1081_1 and the second sub-line of first connecting line 1081_2 are located on two sides of the plurality of multiplex switches 1051. The second connecting line 1082 includes a first sub-line of second connecting line 1082_1 and a second sub-line of second connecting line 1082_2, and the first sub-line of second connecting line 1082_1 and the second sub-line of second connecting line 1082_2 are located on two sides of the plurality of multiplex switches 1051. The at least two control lines 1052 include a first control line 1052_1 (MUX1) and a second control line 1052_2 (MUX2). The second control line 1052_2 is located on a side of the first control line 1052_1 away from the active area 1011. As shown in FIG. 10, the first sub-line of first connecting line 1081_1 and the second sub-line of first connecting line 1081_2 are respectively coupled to two end points of the first control line 1052_1, and the first sub-line of second connecting line 1082_1 and the second sub-line of second connecting line 1082_2 are respectively coupled to two end points of the second control line 1052_2.

As shown in FIG. 10, the plurality of second pads 1072 include a plurality of first sub-pads of second pads 1072_1 and a plurality of second sub-pads of second pads 1072_2. The plurality of first sub-pads of second pads 1072_1 and the plurality of second sub-pads of second pads 1072_2 are respectively located on two sides of the plurality of first pads 1071 in the extension direction along the boundary of the active area 1011. As shown in FIG. 10, the first sub-line of first connecting line 1081_1 and the first sub-line of second connecting line 1082_1 are electrically coupled to the plurality of first sub-pads of second pads 1072_1, and the second sub-line of first connecting line 1081_2 and the second sub-line of second connecting line 1082_2 are electrically coupled to the plurality of second sub-pads of second pads 1072_2.

As shown in FIG. 10, the display substrate 100 further includes a plurality of third pads 1073. The plurality of third pads 1073 are arranged along the extension direction of the boundary of the active area 1011, and are located on a side of the plurality of first pads 1071 and the plurality of first sub-pads of second pads 1072_1 and the plurality of second sub-pads of second pads 1072_2 away from the active area 1011. The plurality of first pads 1071, the plurality of first sub-pads of second pads 1072_1, the plurality of second sub-pads of second pads 1072_2, and the plurality of third pads 1073 may be used to be bound to an integrated circuits (IC). As shown in FIG. 10, the display substrate 100 further includes a plurality of fourth pads 1074. The plurality of fourth pads 1074 are arranged along the extension direction of the boundary of the active area 1011, and are located on a side of the plurality of third pads 1073 away from the active area 1011. The plurality of fourth pads 1074 includes a plurality of first sub-pads of fourth pads 1074_1 and a plurality of second sub-pads of fourth pads 1074_2. The plurality of first sub-pads of fourth pads 1074_1 and the plurality of second sub-pads of fourth pads 1074_2 are respectively located on two sides of the plurality of third pads 1073 in the extension direction along the boundary of the active area 1011.

As shown in FIG. 10, the first power bus 109 includes a first sub-line of first power bus 109_1 and a second sub-line of first power bus 109_2. The first sub-line of first power bus 109_1 and the second sub-line of first power bus 109_2 are respectively located on two sides of the plurality of multiplex switches 1051. The first sub-line of first power bus 109_1 is electrically coupled to the plurality of first sub-pads of fourth pads 1074_1, and the second sub-line of first power bus 109_2 is electrically coupled to the plurality of second sub-pads of fourth pads 1074_2.

As shown in FIG. 10, orthographic projections of the first sub-line of first connecting line 1081_1 and the first sub-line of the second connecting line 1082_1 on the base substrate 101 at least partially overlap with an orthographic projection of the first sub-line of first power bus 109_1 on the base substrate 101. Orthographic projections of the second sub-line of first connecting line 1081_2 and the second sub-line of the second connecting line 1082_2 on the base substrate 101 at least partially overlap with an orthographic projection of the second sub-line of first power bus 109_2 on the base substrate 101.

As shown in FIG. 10, the second power line includes a first sub-line of second power line 110_1 and a second sub-line of second power line 110_2. The first sub-line of second power line 110_1 and the second sub-line of second power line 110_2 are respectively located on two sides of the plurality of multiplex switches 1051. The first sub-line of second power line 110_1 is electrically coupled to the plurality of first sub-pads of fourth pads 1074_1, and the second sub-line of second power line 110_2 is electrically coupled to the plurality of second sub-pads of fourth pads 1074_2.

As shown in FIG. 10, the orthographic projections of the first sub-line of first connecting line 1081_1 and the first sub-line of the second connecting line 1082_1 on the base substrate 101 at least partially overlap with an orthographic projection of the first sub-line of second power line 110_1 on the base substrate 101. The orthographic projections of second sub-line of first connecting line 1081_2 and the second sub-line of the second connecting line 1082_2 on the base substrate 101 at least partially overlap with an orthographic projections of the second sub-line of second power line 110_2 on the base substrate 101.

As shown in FIG. 10, the first switch signal line SWR includes a first sub-line of first switch signal line SWR_1 and a second sub-line of first switch signal line SWR_2. The second switch signal line SWG includes a first sub-line of second switch signal line SWG_1 and a second sub-line of second switch signal line SWG_2. The third switch signal line SWB includes a first sub-line of third switch signal line SWB_1 and a second sub-line of third switch signal line SWB_2. The fourth switch signal line SWD includes a first sub-line of fourth switch signal line SWD_1 and a second sub-line of fourth switch signal line SWD_2. As shown in FIG. 10, the first sub-line of first switch signal line SWR_1, the first sub-line of second switch signal line SWG_1, the first sub-line of third switch signal line SWB_1, and the first sub-line of fourth switch signal line SWD_1 are electrically coupled to the plurality of first sub-pads of fourth pads 1074_1. The second sub-line of first switch signal line SWR_2, the second sub-line of second switch signal line SWG_2, the second sub-line of third switch signal line SWB_2, and the second sub-line of fourth switch signal line SWD_2 are electrically coupled to the plurality of second sub-pads of fourth pads 1074_2.

As shown in FIG. 10, the orthographic projections of the first sub-line of first connecting line 1081_1 and the first sub-line of the second connecting line 1082_1 on the base substrate 101 at least partially overlap with an orthographic projection of at least one of the first sub-line of first switch signal line SWR_1, the first sub-line of second switch signal line SWG_1, the first sub-line of third switch signal line SWB_1, and the first sub-line of fourth switch signal line SWD_1 on the base substrate 101. The orthographic projections of the second sub-line of first connecting line 1081_2 and the second sub-line of second connecting line 1082_2 on the base substrate 101 at least partially overlap with an orthographic projection of at least one of the second sub-line of first switch signal line SWR_2, the second sub-line of second switch signal line SWG_2, the second sub-line of third switch signal line SWB_2 and the second sub-line of fourth switch signal line SWD_2 on the base substrate 101. In some embodiments, the orthographic projections of the second sub-line of first connecting line 1081_2 and the second sub-line of second connecting line 1082_2 at least partially overlap with an orthographic projection each of the second sub-line of first switch signal line SWR_2, the second sub-line of second switch signal line SWG_2, the second sub-line of third switch signal line SWB_2 and the second sub-line of fourth switch signal line SWD_2 on the base substrate 101.

It is easy to understand that arrangements of the at least two connecting lines in above two or more embodiments may be combined with each other to obtain a waveform of the selection signal meeting design requirements, so as to reduce the electromagnetic interference generated by the selection signal. Any layout of the at least two connecting lines obtained by combining various embodiments is within the protection scope of the present disclosure.

Figure 11:
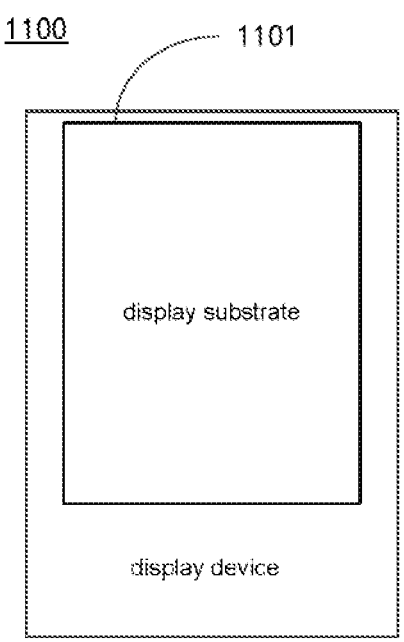
FIG. 11 shows a schematic structural diagram of a display device according to embodiments of the present disclosure.

The embodiments of the present disclosure also provide a display panel and a display device, including the display substrate described with reference to above embodiments. FIG. 11 shows a schematic structural diagram of a display device 1100 according to embodiments of the present disclosure. As shown in FIG. 11, a display device 1100 according to embodiments of the present disclosure includes a display substrate 1101 according to embodiments of the present disclosure. The display device 1100 according to the embodiments of the present disclosure may be any product or component with a display function such as electronic paper, mobile phone, tablet computer, television, display, notebook computer, digital photo frame, navigator, etc.

Although the present disclosure has been described with reference to a few typical embodiments, it should be understood that the terms used are illustrative and exemplary rather than restrictive. Since the present disclosure can be implemented in various forms without departing from the spirit or essence of the disclosure, it should be understood that above-mentioned embodiments are not limited to any of foregoing details, but should be interpreted broadly within the spirit and scope defined by the appended claims. Therefore, all changes and modifications falling within the scope of the claims or their equivalents shall be covered by the appended claims.

We claim:

1. A display substrate, comprising:
   a base substrate comprising an active area and a peripheral area surrounding the active area;
   a plurality of sub-pixels located in the active area;
   a plurality of data lines located in the active area and electrically coupled to the plurality of sub-pixels;
   a plurality of first data line leads located in the peripheral area and electrically coupled to the plurality of data lines;
   a plurality of multiplex switches located in the peripheral area and on a side of the plurality of first data line leads away from the active area;
   at least two control lines located in the peripheral area and electrically coupled to the plurality of multiplex switches;
   a plurality of second data line leads located in the peripheral area and on a side of the plurality of multiplex switches away from the active area;
   a plurality of pads located in the peripheral area and on a side of the plurality of second data line leads away from the active area, wherein the plurality of pads comprise a plurality of first pads and a plurality of second pads, the plurality of second pads are located on at least one side of the plurality of first pads in an extension direction along a boundary of the active area, and the plurality of first pads are electrically coupled to the plurality of second data line leads; and
   at least two connecting lines coupled to the at least two control lines and at least two of the plurality of second pads; wherein
   at least one of the plurality of multiplex switches is electrically coupled to at least two of the plurality of first data line leads and one of the plurality of second data line leads, and a length of any of the at least two connecting lines is longer than a vertical distance from any of the at least two second pads to any of the at least two control lines coupled to any of the at least two connecting lines.

2. The display substrate of claim 1, wherein the at least two control lines comprise a first control line and a second control line; and
   at least one of the plurality of multiplex switches comprises a first transistor and a second transistor, a gate of the first transistor is electrically coupled to the first control line, and a gate of the second transistor is electrically coupled to the second control line.

3. The display substrate of claim 1, further comprising a plurality of first power lines located in the active area and a first power bus located in the peripheral area, wherein the plurality of first power lines are electrically coupled to the first power bus, and the plurality of first power lines are electrically coupled to the plurality of sub-pixels; and
   wherein, orthographic projections of the at least two connecting lines on the base substrate at least partially overlap with an orthographic projection of the first power bus on the base substrate.

4. The display substrate of claim 3, further comprising a second power line located in the peripheral area and surrounding the active area; wherein
   the orthographic projections of the at least two connecting lines on the base substrate at least partially overlap with an orthographic projection of the second power line on the base substrate.

5. The display substrate of claim 4, wherein the at least two connecting lines comprise a first wiring segment and a second wiring segment extending in a first direction and a third wiring segment extending in a second direction, and the third wiring segment is coupled to the first wiring segment and the second wiring segment; and
   wherein orthographic projections of the first wiring segment and the second wiring segment on the base substrate at least partially overlap with the orthographic projections of the first power bus and the second power line on the base substrate respectively.

6. The display substrate of claim 1, further comprising:
   a first switch signal line, a second switch signal line, a third switch signal line and a fourth switch signal line, located between the plurality of multiplex switches and the active area;
   a first unit testing circuit located between the plurality of multiplex switches and the active area, wherein the first unit testing circuit comprises a plurality of first testing sub-circuits, at least one of the plurality of first testing sub-circuits comprises a third transistor, a fourth transistor and a fifth transistor, a gate of the third transistor is electrically coupled to the first switch signal line, a gate of the fourth transistor is electrically coupled to the second switch signal line, and a gate of the fifth transistor is electrically coupled to the third switch signal line; and
   a second unit testing circuit located between the first unit testing circuit and the plurality of multiplex switches, wherein the second unit testing circuit comprises a plurality of second testing sub-circuits, at least one of the plurality of second testing sub-circuits comprises a sixth transistor, and a gate of the sixth transistor is electrically coupled to the fourth switch signal line; wherein
   orthographic projections of the at least two connecting lines on the base substrate at least partially overlap with an orthographic projection of at least one of the first switch signal line, the second switch signal line, the third switch signal line and the fourth switch signal line on the base substrate.

7. The display substrate of claim 6, wherein the at least two connecting lines comprise a first wiring segment and a second wiring segment extending in a first direction and a third wiring segment extending in a second direction, and the third wiring segment is coupled to the first wiring segment and the second wiring segment; and
   wherein orthographic projections of the first wiring segment and the second wiring segment on the base substrate at least partially overlap with orthographic projections of the first switch signal line, the second switch signal line, the third switch signal line and the fourth switch signal line on the base substrate respectively.

8. The display substrate of claim 1, wherein the at least two connecting lines comprise a first connecting line and a second connecting line, the first connecting line comprises a first sub-line of first connecting line and a second sub-line of first connecting line, and the second connecting line comprises a first sub-line of second connecting line and a second sub-line of second connecting line:
   the at least two control lines comprise a first control line and a second control line, and the second control line is located on a side of the first control line away from the active area; and
   the first sub-line of first connecting line and the second sub-line of first connecting line are respectively coupled to two end points of the first control line, and the first sub-line of second connecting line and the second sub-line of second connecting line are respectively coupled to two end points of the second control line.

9. The display substrate of claim 8, further comprising a plurality of first power lines located in the active area and a first power bus located in the peripheral area, wherein the plurality of first power lines are electrically coupled to the first power bus, and the plurality of first power lines are electrically coupled to the plurality of sub-pixels;
   the first power bus comprises a first sub-line of first power bus and a second sub-line of first power bus, wherein the first sub-line of first power bus and the second sub-line of first power bus are respectively located on two sides of the plurality of multiplex switches; and
   wherein orthographic projections of the first sub-line of first connecting line and the first sub-line of second connecting line on the base substrate at least partially overlap with an orthographic projection of the first sub-line of first power bus on the base substrate, and orthographic projections of the second sub-line of first connecting line and the second sub-line of second connecting line on the base substrate at least partially overlap with an orthographic projection of the second sub-line of first power bus on the base substrate.

10. The display substrate of claim 9, further comprising a second power line located in the peripheral area and surrounding the active area;
    wherein the second power line comprises a first sub-line of second power line and a second sub-line of second power line, and the first sub-line of second power line and the second sub-line of second power line are respectively located on two sides of the plurality of multiplex switches; and
    wherein the orthographic projections of the first sub-line of first connecting line and the first sub-line of second connecting line on the base substrate at least partially overlap with an orthographic projection of the first sub-line of second power line on the base substrate, and the orthographic projections of the second sub-line of first connecting line and the second sub-line of second connecting line on the base substrate at least partially overlap with an orthographic projections of the second sub-line of second power line on the base substrate.

11. The display substrate of claim 10, further comprising, between the plurality of multiplex switches and the active area:
    a first switch signal line comprising a first sub-line of first switch signal line and a second sub-line of first switch signal line,
    a second switch signal line comprising a first sub-line of second switch signal line and a second sub-line of second switch signal line,
    a third switch signal line comprising a first sub-line of third switch signal line and a second sub-line of third switch signal line, and
    a fourth switch signal line comprising a first sub-line of fourth switch signal line and a second sub-line of fourth switch signal line; wherein
    the at least two connecting lines comprise a first connecting line and a second connecting line, the first connecting line comprises a first sub-line of first connecting line and a second sub-line of first connecting line, and the second connecting line comprises a first sub-line of second connecting line and a second sub-line of second connecting line;
    the first sub-line of first connecting line, the first sub-line of second connecting line, the second sub-line of first connecting line, and the second sub-line of second connecting line are respectively located on two sides of the plurality of multiplex switches;
    orthographic projections of the first sub-line of first connecting line and the first sub-line of second connecting line on the base substrate at least partially overlap with an orthographic projection of at least one of the first sub-line of first switch signal line, the first sub-line of second switch signal line, the first sub-line of third switch signal line and the first sub-line of fourth switch signal line on the base substrate;
    orthographic projections of the second sub-line of first connecting line and the second sub-line of second connecting line on the base substrate at least partially overlap with an orthographic projection of at least one of the second sub-line of first switch signal line, the second sub-line of second switch signal line, the second sub-line of third switch signal line and the second sub-line of fourth switch signal line on the base substrate.

12. The display substrate of claim 11, wherein the plurality of second pads comprise a plurality of first sub-pads of second pads and a plurality of second sub-pads of second pads, wherein the plurality of first sub-pads of second pads and the plurality of second sub-pads of second pads are respectively located on two sides of the plurality of first pads in the extension direction along the boundary of the active area.

13. The display substrate of claim 12, wherein the first sub-line of first connecting line and the first sub-line of second connecting line are electrically coupled to the plurality of first sub-pads of second pads, and the second sub-line of first connecting line and the second sub-line of second connecting line are electrically coupled to the plurality of second sub-pads of second pads.

14. The display substrate of claim 13, wherein the plurality of pads further comprise a plurality of third pads arranged along the extension direction of the boundary of the active area, and located on a side of the plurality of first pads and the plurality of second pads away from the active area, wherein the plurality of first pads, the plurality of second pads and the plurality of third pads are configured to be bound to an integrated circuit.

15. The display substrate of claim 14, further comprising a plurality of fourth pads arranged along the extension direction of the boundary of the active area, and located on a side of the plurality of third pads away from the active area, wherein the first switch signal line, the second switch signal line, the third switch signal line, and the fourth switch signal line are electrically coupled to the plurality of fourth pads.

16. The display substrate of claim 15, wherein the plurality of fourth pads comprise a plurality of first sub-pads of fourth pads and a plurality of second sub-pads of fourth pads, and the plurality of first sub-pads of fourth pads and the plurality of second sub-pads of fourth pads are respectively located on two sides of the plurality of third pads in the extension direction along the boundary of the active area;

the first sub-line of first switch signal line, the first sub-line of second switch signal line, the first sub-line of third switch signal line, and the first sub-line of fourth switch signal line are electrically coupled to the plurality of first sub-pads of fourth pads; and the second sub-line of first switch signal line, the second sub-line of second switch signal line, the second sub-line of third switch signal line, and the second sub-line of fourth switch signal line are electrically coupled to the plurality of second sub-pads of fourth pads.

17. The display substrate of claim 16, wherein the first sub-line of first power bus and the first sub-line of second power line are electrically coupled to the plurality of first sub-pads of fourth pads, and the second sub-line of first power bus and the second sub-line of second power line are electrically coupled to the plurality of second sub-pads of fourth pads.

18. The display substrate of claim 1, wherein resistance of the at least two connecting lines is in a range of 400Ω to 600 Ω.

19. A display panel comprising the display substrate of claim 1.

20. A display device comprising the display substrate of claim 1.

* * * * *